US009548325B2

(12) United States Patent
Chin et al.

(10) Patent No.: US 9,548,325 B2
(45) Date of Patent: Jan. 17, 2017

(54) METHOD FOR MANUFACTURING A THIN FILM TRANSISTOR ARRAY PANEL

(71) Applicant: Samsung Display Co., Ltd., Yongin-si (KR)

(72) Inventors: Hong-Kee Chin, Suwon-si (KR); Yun Jong Yeo, Seoul (KR); Sang Gab Kim, Seoul (KR); Jung Suk Bang, Guri-Si (KR); Byeong Hoon Cho, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 14/992,625

(22) Filed: Jan. 11, 2016

(65) Prior Publication Data

US 2016/0190186 A1    Jun. 30, 2016

Related U.S. Application Data

(62) Division of application No. 13/927,781, filed on Jun. 26, 2013, now abandoned.

(30) Foreign Application Priority Data

Dec. 20, 2012 (KR) .................. 10-2012-0149854

(51) Int. Cl.
*H01L 21/84* (2006.01)
*H01L 21/00* (2006.01)
(Continued)

(52) U.S. Cl.
CPC ....... *H01L 27/1288* (2013.01); *H01L 21/3081* (2013.01); *H01L 21/3086* (2013.01);
(Continued)

(58) Field of Classification Search
CPC .......... H01L 27/1446; H01L 31/03765; H01L 31/204; H01L 31/1136; H01L 27/1288; H01L 27/1218; H01L 27/127; H01L 21/3081; H01L 21/3086; H01L 21/32139; H01L 27/1251; H01L 21/84
(Continued)

(56) References Cited

U.S. PATENT DOCUMENTS 6,144,082 A    11/2000    Yamazaki et al.
6,570,197 B2    5/2003    Joo
(Continued)

FOREIGN PATENT DOCUMENTS

KR    10-0537376    7/2000
KR    10-0575032    9/2000
(Continued)

OTHER PUBLICATIONS

Non-Final Office Action issued on Aug. 27, 2014, in U.S. Appl. No. 13/927,781.
(Continued)

*Primary Examiner* — Shouxiang Hu
(74) *Attorney, Agent, or Firm* — H.C. Park & Associates, PLC

(57) ABSTRACT

A thin film transistor array panel includes a substrate, an insulation layer, a first semiconductor, and a second semiconductor. The insulation layer is disposed on the substrate and includes a stepped portion. The first semiconductor is disposed on the insulation layer. The second semiconductor is disposed on the insulation layer and includes a semiconductor material different than the first semiconductor. The stepped portion is spaced apart from an edge of the first semiconductor.

13 Claims, 20 Drawing Sheets

(51) Int. Cl.
*H01L 21/8234* (2006.01)
*H01L 27/12* (2006.01)
*H01L 21/306* (2006.01)
*H01L 21/308* (2006.01)
*H01L 21/3213* (2006.01)
*H01L 27/144* (2006.01)
*H01L 31/0376* (2006.01)
*H01L 31/113* (2006.01)
*H01L 31/20* (2006.01)

(52) U.S. Cl.
CPC .. *H01L 21/30604* (2013.01); *H01L 21/32139* (2013.01); *H01L 21/84* (2013.01); *H01L 27/127* (2013.01); *H01L 27/1218* (2013.01); *H01L 27/1251* (2013.01); *H01L 27/1446* (2013.01); *H01L 31/03765* (2013.01); *H01L 31/1136* (2013.01); *H01L 31/204* (2013.01)

(58) Field of Classification Search
USPC .................................. 438/164, 149, 158, 275
See application file for complete search history.

(56) References Cited

U.S. PATENT DOCUMENTS

| | | |
|---|---|---|
| 8,101,979 B2 | 1/2012 | Choi |
| 8,174,015 B2 | 5/2012 | Jeong et al. |
| 2007/0187689 A1* | 8/2007 | Oh .................. H01L 27/124 257/72 |
| 2010/0171120 A1 | 7/2010 | Gosain et al. |
| 2011/0012115 A1 | 1/2011 | Jeon et al. |
| 2011/0032461 A1 | 2/2011 | Cho et al. |
| 2011/0057189 A1* | 3/2011 | Jeong .................. G06F 3/0421 257/59 |
| 2011/0156040 A1* | 6/2011 | Kwack ................ H01L 27/0207 257/59 |
| 2012/0033161 A1 | 2/2012 | Han et al. |
| 2012/0138960 A1 | 6/2012 | Kim et al. |

FOREIGN PATENT DOCUMENTS

| | | |
|---|---|---|
| KR | 10-2005-0072956 | 7/2005 |
| KR | 10-2013-0110575 | 10/2013 |

OTHER PUBLICATIONS

Final Office Action issued on Feb. 9, 2015, in U.S. Appl. No. 13/927,781.

Non-Final Office Action issued May 26, 2015, in U.S. Appl. No. 13/927,781.

Final Office Action issued Nov. 20, 2015, in U.S. Appl. No. 13/927,781.

* cited by examiner

METHOD FOR MANUFACTURING A THIN FILM TRANSISTOR ARRAY PANEL

CROSS-REFERENCE TO RELATED APPLICATION

This application is a divisional of U.S. patent application Ser. No. 13/927,781, filed on Jun. 26, 2013 and claims priority from and the benefit of Korean Patent Application No. 10-2012-0149854, filed on Dec. 20, 2012, which are incorporated by reference for all purposes as if set forth herein.

BACKGROUND

Field

Exemplary embodiments relate to a thin film transistor array panel and a manufacturing method thereof.

Discussion

Thin film transistors (TFTs) are used in various electronic devices, such as flat panel displays. For example, TFTs are used as switching devices or driving devices in flat panel displays, such as liquid crystal display (LCDs), organic light emitting diode (OLED) displays, plasma displays (PDs), electrophoretic displays (EPDs), electrowetting displays (EWDs), and the like.

A TFT typically includes a gate electrode connected to a gate line transmitting a scan signal, a source electrode connected to a data line transmitting a signal to be applied to a pixel electrode, a drain electrode facing the source electrode, and a semiconductor connected to the source electrode and the drain electrode. Among these components, the semiconductor, which is a significant factor in determining the characteristics of a TFT, may be formed of, for instance, amorphous silicon, poly-crystalline silicon, etc., an oxide-based material, etc.

When used in association with flat panel displays, a TFT array panel may include a plurality of TFTs, which may include various different types of semiconductor materials, as well as include two or more semiconductor layers formed, for instance, in different patterning steps. For example, a TFT array panel may include a TFT including a semiconductor layer including poly-crystalline silicon and a TFT including a semiconductor layer including amorphous silicon. When the semiconductor layer is formed by using, for example, one or more photolithographic processes, the different semiconductor layers may be formed using different optical masks (or reticles) in different patterning steps.

Accordingly, a first semiconductor may be formed between the different semiconductor layers included in the TFT array panel and, thereby, referred to as a first semiconductor, and a semiconductor formed later may be referred to as a second semiconductor. The first semiconductor may be patterned before the second semiconductor through, for example, an etching process. An etching passivation layer may be disposed on the patterned first semiconductor to protect the first semiconductor. An edge portion of the first semiconductor may be exposed during another etching process to form the second semiconductor. In this manner, uneven protrusions may be created at the edge portion of the first semiconductor. As such, when an electrode is formed on the uneven protrusions at the edge of the first semiconductor, the electrode may be short-circuited.

Therefore, there is a need for an approach that provides efficient, cost effective techniques to manufacture TFT array panels to prevent (or otherwise reduce) the potential for short-circuits due to, for example, uneven protrusions.

The above information disclosed in this Background section is only for enhancement of understanding of the background of the invention, and therefore, it may contain information that does not form the prior art that is already known in this country to a person of ordinary skill in the art.

SUMMARY

Exemplary embodiments provide TFT array panels manufactured to prevent (or otherwise reduce) uneven protrusions from being generated in, for instance, edge portions of semiconductors in the TFT array panel, which may include two or more different semiconductor layers formed via different etching (or patterning) steps. In this manner, exemplary embodiments prevent (or otherwise reduce) the potential of an electrode formed on the edge portion of the semiconductor from being short-circuited by forming the edge portion of the semiconductor in, for example, a step shape (or other suitable pattern), which prevents (or otherwise reduces) the potential for defects in a corresponding TFT including the semiconductor.

Additional aspects will be set forth in the detailed description which follows and, in part, will be apparent from the disclosure, or may be learned by practice of the invention.

According to exemplary embodiments, a method of manufacturing a thin film transistor array panel, includes: forming a first insulation layer on a substrate; forming a first semiconductor material layer on the first insulation layer; forming an etching passivation material layer on the first semiconductor material layer; forming a first photoresist layer on the etching passivation material layer; etching, using the first photoresist layer as a mask, the etching passivation material layer to form an etching passivation layer; etching, using the first photoresist layer as a mask, the first semiconductor material layer to form a first semiconductor pattern including a protrusion not covered by the etching passivation layer; forming, sequentially, a second insulation layer and a second semiconductor material layer on the etching passivation layer and the first semiconductor pattern; forming a second photoresist layer on the second semiconductor material layer; etching, using the second photoresist layer as a mask, the second semiconductor material layer to form a first semiconductor; etching the first insulation layer not covered by the second photoresist layer and the protrusion not covered by the etching passivation layer to form a second semiconductor including an undercut region under the etching passivation layer; and forming, in the first insulation layer, a stepped portion spaced apart from an edge of the second semiconductor.

According to exemplary embodiments, a thin film transistor array panel, includes: a substrate; an insulation layer disposed on the substrate, the insulation substrate layer including a stepped portion; a first semiconductor disposed on the insulation layer; and a second semiconductor disposed on the insulation layer, the second semiconductor including a semiconductor material different than the first semiconductor, the stepped portion being spaced apart from an edge of the first semiconductor.

According to exemplary embodiments, it is possible to prevent (or otherwise reduce) uneven protrusions from being generated at, for instance, an edge portion of a semiconductor and to form an edge portion of the semiconductor in a step shape in the thin film transistor array panel, which may include two or more different semiconductor layers that may be formed in different etching (or other patterning) steps. In this manner, exemplary embodiments prevent (or otherwise reduce) the potential of an electrode disposed on the edge portion from being short-circuited, which prevents (or otherwise reduces) the potential for defects in a corresponding TFT including the semiconductor.

The foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the principles of the invention.

DETAILED DESCRIPTION OF THE ILLUSTRATED EMBODIMENTS

Figure 1:
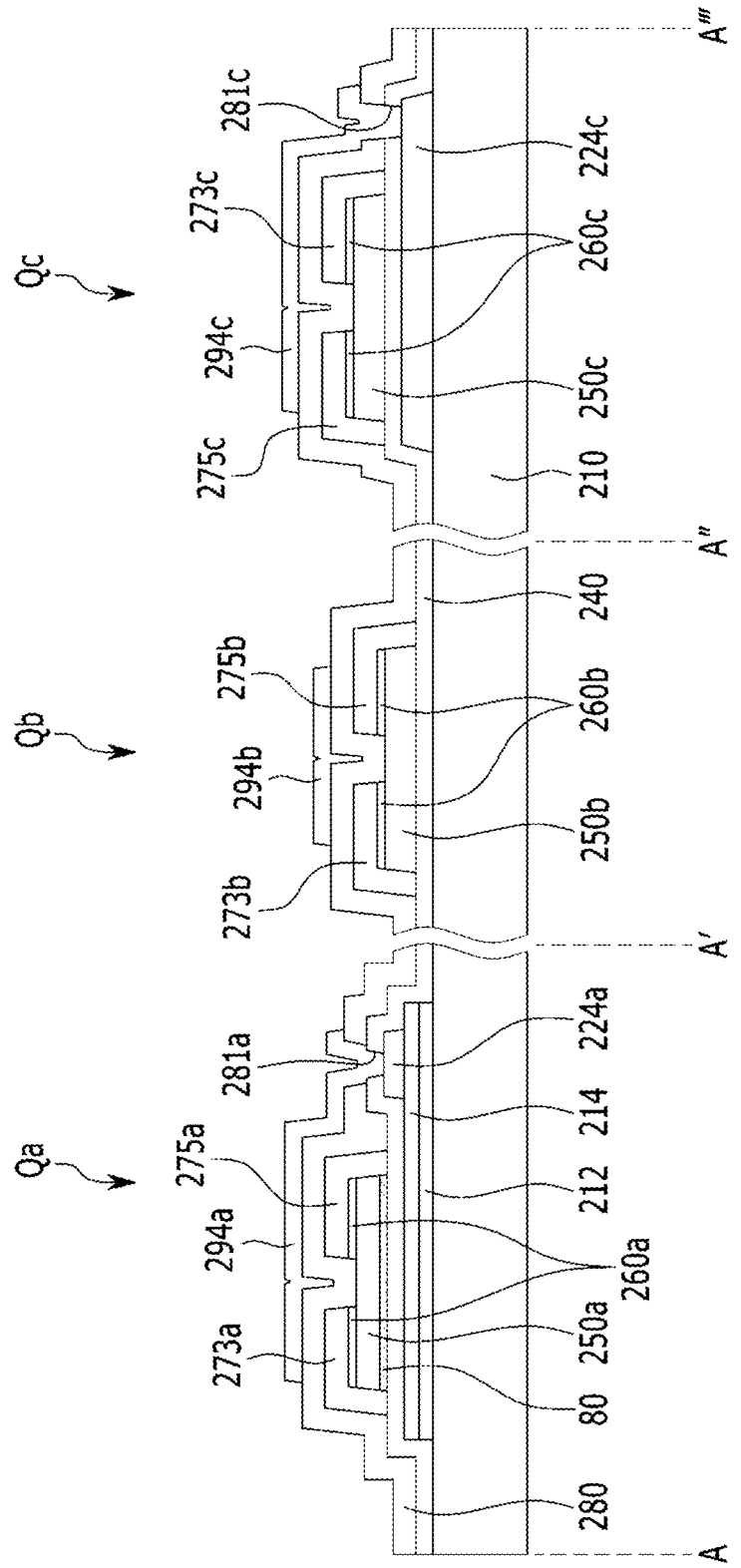
FIG. 1 is a cross-sectional view of three thin film transistors included in a thin film transistor array panel, according to exemplary embodiments.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers and/or sections, these elements, components, regions, layers and/or sections should not be limited by these terms. These terms are used to distinguish one element, component, region, layer or section from another region, layer or section. Thus, a first element, component, region, layer or section discussed below could be termed a second element, component, region, layer or section without departing from the teachings of the present disclosure.

Spatially relative terms, such as "beneath," "below," "lower," "above," "upper," and/or the like, may be used herein for descriptive purposes, and thereby, to describe one element or feature's relationship to another element(s) or feature(s) as illustrated in the drawings. Spatially relative terms are intended to encompass different orientations of an apparatus in use or operation in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and as such, the spatially relative descriptors used herein interpreted accordingly.

The terminology used herein is for the purpose of describing particular embodiments and is not intended to be limiting. As used herein, the singular forms "a," "an," and "the" are intended to include the plural forms as well, unless the context clearly indicates otherwise. Moreover, the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

Figure 2:
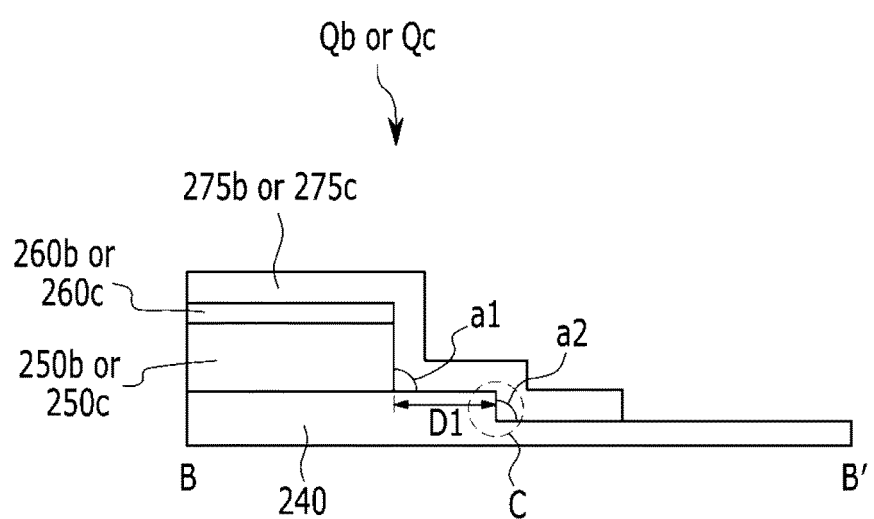
FIG. 2 is a cross-sectional view of an edge portion of a thin film transistor included in the thin film transistor array panel of FIG. 1, according to exemplary embodiments.

FIG. 1 is a cross-sectional view of three thin film transistors included in a thin film transistor array panel, according to exemplary embodiments. FIG. 2 is a cross-sectional view of a thin film transistor included in the thin film transistor array panel of FIG. 1.

According to exemplary embodiments, a thin film transistor array panel includes an insulation substrate 210 and a plurality of thin film transistors (TFTs), such as TFTs Qa, Qb, and Qc, disposed thereon. While only three TFTs are shown, it is contemplated that the TFT array panel may include any suitable number of TFTs. In exemplary embodiments, at least two of the plurality of thin film transistors Qa, Qb, and Qc may include different semiconductor materials, and at least two of the plurality of thin film transistors Qa, Qb, and Qc may have different stacking structures.

Thin film transistor Qa is described first.

An insulator 80 is disposed on the insulation substrate 210. The insulator 80 may include any suitable, uncoated insulation material, such as, for example, silicon nitride (SiNx), silicon oxide (SiOx), etc.

A first semiconductor 250a is disposed on the insulator 80. The first semiconductor 250a may include, for instance, an amorphous or crystalline silicon germanium (SiGe), but may include any other suitable semiconductor material. It is noted, however, that silicon germanium (a-SiGe) has a relatively high quantum efficiency when light of an infrared wavelength band is radiated thereon, as compared to other semiconductor materials.

According to exemplary embodiments, the insulator 80 may be disposed under only the first semiconductor 250a. In this manner, the respective shapes of the insulator 80 and the first semiconductor 250a may be approximately the same in a plan view. The insulator 80 may be configured to improve optical characteristics of the first semiconductor 250a. The insulator 80 may also be configured to improve interface characteristics between an underlying layer and a lower surface of the first semiconductor 250a.

A pair of first ohmic contact members 260a may be disposed on the first semiconductor 250a.

A first source electrode 273a and a first drain electrode 275a are disposed on the first semiconductor 250a. The first source electrode 273a and the first drain electrode 275a face each other on the first semiconductor 250a, and a channel region of the first thin film transistor Qa is formed between the first source electrode 273a and the first drain electrode 275a. It is noted that the first ohmic contact members 260a may be disposed between only the first semiconductor 250a and the first source electrode 273a and the first drain electrode 275a.

A passivation layer 280 is disposed on the first source electrode 273a and the first drain electrode 275a. A first upper gate electrode 294a may be disposed on at least a portion of the passivation layer 280.

According to exemplary embodiments, the first thin film transistor Qa may further include an insulation pattern 212 and a light blocking member 214 disposed between the insulation substrate 210 and the first semiconductor 250a.

In exemplary embodiments, the first thin film transistor Qa may be configured as a light detecting device. In this manner, the light blocking member 214 may allow light of a detected wavelength band to be transmitted and block light of the remaining wavelength bands. For example, when the first thin film transistor Qa is configured as an infrared light detecting device, the light blocking member 214 blocks light of a region of a visible light band and allows infrared light to be transmitted, thereby preventing the first thin film transistor Qa from being influenced by light of the region of the visible light band. The light blocking member 214 may include a compound of, for instance, amorphous germanium, such as, for example, amorphous germanium (a-Ge), amorphous silicon germanium (a-SiGe), and/or the like. The light blocking member 214 may have an island shape hiding the first semiconductor 250a when viewed from below insulation substrate 210.

The insulation pattern 212 may include silicon nitride (SiNx); however, any other suitable material may be utilized. The insulation pattern 212 may improve adhesiveness between the insulation substrate 210 and the light blocking member 214. It is contemplated, that the insulation pattern 212 may be omitted.

According to exemplary embodiments, the first thin film transistor Qa may further include a first lower gate electrode 224a disposed on the light blocking member 214. Further, the first thin film transistor Qa may include a gate insulation layer 240 disposed on the light blocking member 214 and the first lower gate electrode 224a.

The first lower gate electrode 224a may be in direct contact with (e.g., directly disposed on) a portion of the light blocking member 214.

The gate insulation layer 240 may include a first contact hole (or via) 281a through which the first lower gate electrode 224a is exposed. The first upper gate electrode 294a may be connected with the first lower gate electrode 224a through the first contact hole 281a. In this manner, the first lower gate electrode 224a may receive the same voltage as applied to the first upper gate electrode 294a. As such, it is possible to prevent (or otherwise reduce) the light blocking member 214 from being in a floating state.

A second thin film transistor Qb will be described.

According to exemplary embodiments, a second semiconductor 250b is disposed on the insulation substrate 210. The second semiconductor 250b may include a different semiconductor material than the first semiconductor 250a. For instance, the second semiconductor may include, for example, amorphous silicon (a-Si), or any other suitable semiconductor material. It is noted that amorphous silicon (a-Si) has a relatively higher quantum efficiency in the infrared ray region than the visible ray region.

A pair of second ohmic contact members 260b may be disposed on the second semiconductor 250b.

A second source electrode 273b and a second drain electrode 275b are disposed on the second semiconductor 250b. The second source electrode 273b and the second drain electrode 275b face each other on the second semiconductor 250b, and a channel region of the second thin film transistor Qb is formed between the second source electrode 273b and the second drain electrode 275b. It is noted that the second ohmic contact members 260b may be disposed between only the second semiconductor 250b and the second source electrode 273b and the second drain electrode 275b.

The passivation layer 280 is disposed on the second source electrode 273b and the second drain electrode 275b. A second upper gate electrode 294b is disposed on at least a portion of the passivation layer 280. It is noted that the gate insulation layer 240 may be disposed between the second semiconductor 250b and the insulation substrate 210.

A third thin film transistor Qc will be described.

According to exemplary embodiments, a third semiconductor 250c is disposed on the insulation substrate 210. The third semiconductor 250c may include the same material as that of the second semiconductor 250b. For example, the third semiconductor 250c may include amorphous silicon (a-Si), or any other suitable semiconductor material.

A pair of third ohmic contact members 260c may be disposed on the third semiconductor 250c.

A third source electrode 273c and a third drain electrode 275c are disposed on the third semiconductor 250c. The third source electrode 273c and the third drain electrode 275c face each other on the third semiconductor 250c, and a channel region of the third thin film transistor Qc is formed between the third source electrode 273c and the third drain electrode 275c. It is noted that the third ohmic contact members 260c may be disposed between only the third semiconductor 250c and the third source electrode 273c and the third drain electrode 275c.

The passivation layer 280 is disposed on the third source electrode 273c and the third drain electrode 275c. A third upper gate electrode 294c is disposed on at least a portion of the passivation layer 280.

According to exemplary embodiments, the third thin film transistor Qc may further include a third lower gate electrode 224c disposed between the insulation substrate 210 and the third semiconductor 250c. Further, the third thin film transistor Qc may include the gate insulation layer 240 disposed between the third lower gate electrode 224c and the third semiconductor 250c.

The gate insulation layer 240 may include a third contact hole (or via) 281c through which the third lower gate electrode 224c is exposed. The third upper gate electrode 294c may be connected with the third lower gate electrode 224c through the third contact hole 281c.

According to exemplary embodiments, the second semiconductor 250b of the second thin film transistor Qb or the third semiconductor 250c of the third thin film transistor Qc may include a different semiconductor material than the first semiconductor 250a of the first thin film transistor Qa. In this manner, the first semiconductor 250a may be formed in a different etching (or patterning) process than the second semiconductor 250b or the third semiconductor 250c. As such, the second thin film transistor Qb or the third thin film transistor Qc may include a cross-sectional structure as illustrated in, for instance, FIG. 2.

According to exemplary embodiments, one of the second thin film transistor Qb and the third thin film transistor Qc may be omitted.

As previously mentioned, FIG. 2 is a cross-sectional view of an edge portion of a thin film transistor of the thin film transistor array of FIG. 1. For instance, the illustrated edge portion may correspond to an edge portion of the second semiconductor 250b or the third semiconductor 250c.

As seen in FIG. 2, a side surface of the edge of the second semiconductor 250b or the third semiconductor 250c forms a first angle a1 with a surface of an underlying layer (e.g., the gate insulation layer 240) or a surface of the insulation substrate 210. The first angle a1 may be larger than approximately 90 degrees and may be smaller than approximately 180 degrees.

Further, the gate insulation layer 240 disposed under the second semiconductor 250b or the third semiconductor 250c includes a stepped portion (or otherwise suitably shaped portion) C disposed outside the edge of the second semiconductor 250b or the third semiconductor 250c. The stepped portion C is disposed adjacent to the outermost edge of the second semiconductor 250b or the third semiconductor 250c. That is, the stepped portion C may be disposed within a distance D1 from the outermost edge of the second semiconductor 250b or the third semiconductor 250c. In this manner, the stepped portion C may be formed near, and thereby, along the edge of the second semiconductor 250b or the third semiconductor 250c.

According to exemplary embodiments, a thickness of the gate insulation layer 240 disposed under the second semiconductor 250b or the third semiconductor 250c and a thickness of the gate insulation layer 240 between the stepped portion C and the edge of the second semiconductor 250b or the third semiconductor 250c may be larger than the thickness of the gate insulation layer 240 in the remaining portions thereof.

A second angle a2 between a side surface of the gate insulation layer 240 in the stepped portion C and the surface of the insulation substrate 210 or the surface of the gate insulation layer 240 in a remaining portion thereof may be larger than approximately 90 degrees and smaller than approximately 180 degrees.

According to exemplary embodiments, the second semiconductor 250b or the third semiconductor 250c and the gate insulation layer 240 near the edge portion of the second semiconductor 250b or the third semiconductor 250c may include at least two step portions. In this manner, when a conductor, such as the second drain electrode 275b or the third drain electrode 275c crossing and overlapping the edge of the second semiconductor 250b or the third semiconductor 250c, is disposed on the second semiconductor 250b or the third semiconductor 250c, the conductor may be formed to cross over (or otherwise cover) the two steps, such that a profile of the conductor may become smooth and the potential for a short-circuit (or open circuit condition) may be prevented or otherwise reduced. Further, when the angle between the side surface of the step and the surface of the insulation substrate 210 is larger than approximately 90 degrees and smaller than approximately 180 degrees, the profile of the conductor, such as the second drain electrode 275b or the third drain electrode 275c, disposed on the edge portion of the second semiconductor 250b or the third semiconductor 250c, becomes smoother, it is possible to further prevent or otherwise reduce the potential of the conductor from being cut at the edge portion of the second semiconductor 250b or the third semiconductor 250c.

Although FIG. 2 illustrates the second drain electrode 275b or the third drain electrode 275c as the conductor, it is contemplated that the aforementioned description may be equally applied in association with the second source electrode 273b or the third source electrode 273c, which are disposed on an opposing edge portion of the second semiconductor 250b or the third semiconductor 250c.

Figure 3A:
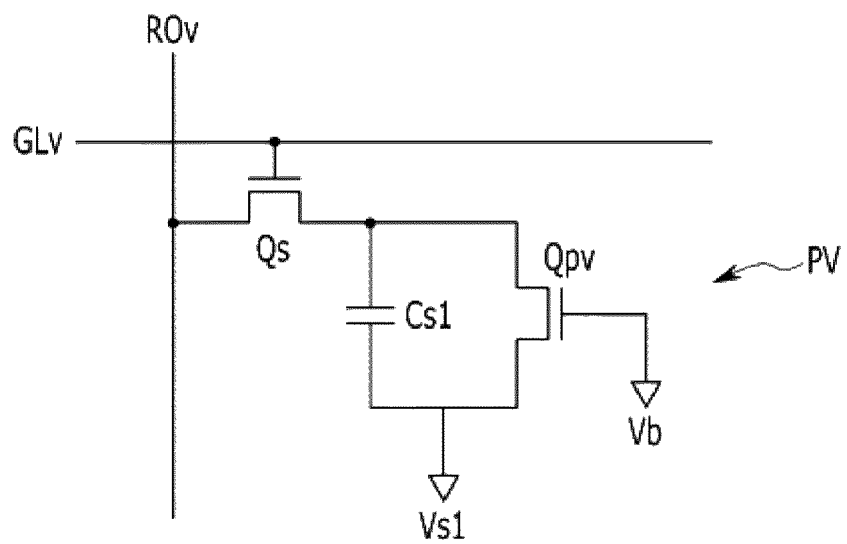
FIGS. 3A and 3B are equivalent circuit diagrams of an optical sensor included in a thin film transistor array panel, according to exemplary embodiments.
Figure 3B:
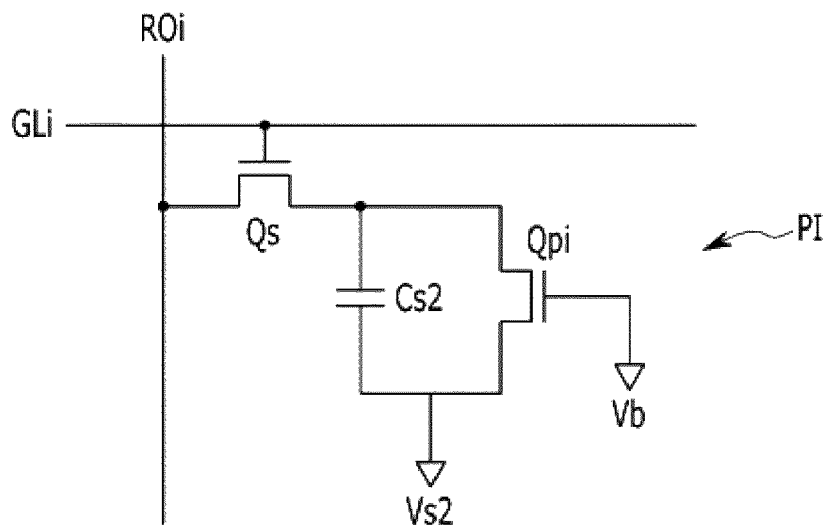

FIGS. 3A and 3B are equivalent circuit diagrams of an optical sensor included in the thin film transistor array panel, according to exemplary embodiments.

As seen in FIGS. 3A and 3B, the thin film transistor array panel may include a visible light sensor PV and an infrared light sensor PI as the optical sensor configured to sense light. The visible light sensor PV may recognize an image by sensing visible light reflected from the image, such as a photograph and a barcode. The infrared light sensor PI may recognize a touch by sensing infrared light reflected by a touch of a finger, or the like. According to exemplary embodiments, the optical sensor may be integrated in the thin film transistor array panel of FIG. 1. In this manner, the thin film transistor array panel may be included in various types of displays, such as a liquid crystal display (LCD), an organic light emitting diode (OLED) display, a plasma display (PD), an electrophoretic display (EPD), an electrowetting display (EWD), and/or the like. As such, the display may include at least one among an infrared light source and a visible light source.

Referring to FIG. 3A, the visible light sensor PV includes a switching transistor Qs, a visible light sensing transistor Qpv, and a first sensing capacitor Cs1.

An input terminal of the visible light sensing transistor Qpv is connected to an output terminal of the switching transistor Qs, and the output terminal thereof is connected to a terminal of a first driving voltage Vs1, and a control terminal thereof is connected to a terminal of a reference voltage Vb.

An input terminal of the switching transistor Qs is connected to a visible light sensing signal line ROv, an output terminal is connected to an input terminal of the visible light sensing transistor Qpv, and a control terminal is connected to a visible light sensing gate line GLv.

Both terminals of the first sensing capacitor Cs1 are connected to an input terminal and an output terminal of the visible light sensing transistor Qpv, respectively.

Referring to FIG. 3B, the infrared light sensor PI includes a switching transistor Qs, an infrared light sensing transistor Qpi, and a second sensing capacitor Cs2.

An input terminal of the infrared light sensing transistor Qpi is connected to an output terminal of the switching transistor Qs, an output terminal thereof is connected to a terminal of a second driving voltage Vs2, and a control terminal thereof is connected to a terminal of a reference voltage Vb.

An input terminal of the switching transistor Qs is connected to an infrared light sensing signal line ROi, an output terminal thereof is connected to an input terminal of the infrared light sensing transistor Qpi, and a control terminal thereof is connected to an infrared light sensing gate line GLi.

Both terminals of the second sensing capacitor Cs2 are connected to an input terminal and an output terminal of the infrared light sensing transistor Qpi, respectively.

The visible light sensing gate line GLv and the infrared light sensing gate line GLi may be a common wiring line or independent wiring lines. Further, the visible light sensing signal line ROv and the infrared light sensing signal line ROi may be a common wiring line or independent wiring lines.

The visible light sensing transistor Qpv and the infrared light sensing transistor Qpi may receive the first driving voltage Vs1 and the second driving voltage Vs2, respectively.

According to exemplary embodiments, a TFT array panel may include a plurality of visible light sensors PV adjacently disposed at upper, lower, left, and right sides of corresponding infrared light sensors PI. As such, a plurality of infrared light sensors PI may be adjacently disposed at upper, lower, left, and right sides of corresponding visible light sensors PV. Additionally (or alternatively), a TFT array panel may include a plurality of visible light sensors PV adjacently disposed in a row direction, and a plurality of infrared light sensors PI adjacently disposed in a row direction.

The visible light sensor PV and the infrared light sensor PI generate a sensing signal by sensing a change in light by, for instance, a touch (or near touch) to a surface of a corresponding display panel including the visible light sensor PV and the infrared light sensor PI. More specifically, when the switching transistor Qs is turned on, the first sensing capacitor Cs1 or the second sensing capacitor Cs2 is charged by the reference voltage Vb transmitted by the sensing signal lines ROv and ROi. When light is radiated to the visible light sensing transistor Qpv or the infrared light sensing transistor Qpi due to a touch (or near touch) of an external object, or the like, in a state where the switching transistor Qs is turned off, current is generated in the visible light sensing transistor Qpv or the infrared light sensing transistor Qpi. As such, the first sensing capacitor Cs1 or the second sensing capacitor Cs2 is discharged. However, when the touch (or near touch) by the external object, or the like, is not generated so that light is not radiated to the visible light sensing transistor Qpv or the infrared light sensing transistor Qpi, the first sensing capacitor Cs1 or the second sensing capacitor Cs2 is not discharged. In this manner, when the switching transistor Qs is turned on, the sensing signal is generated while the reference voltage Vb is recharged in the first sensing capacitor Cs1 or the second sensing capacitor Cs2 through the turned-on switching transistor Qs, and the generated sensing signal is output to the sensing signal lines ROv and ROi.

Figure 4:
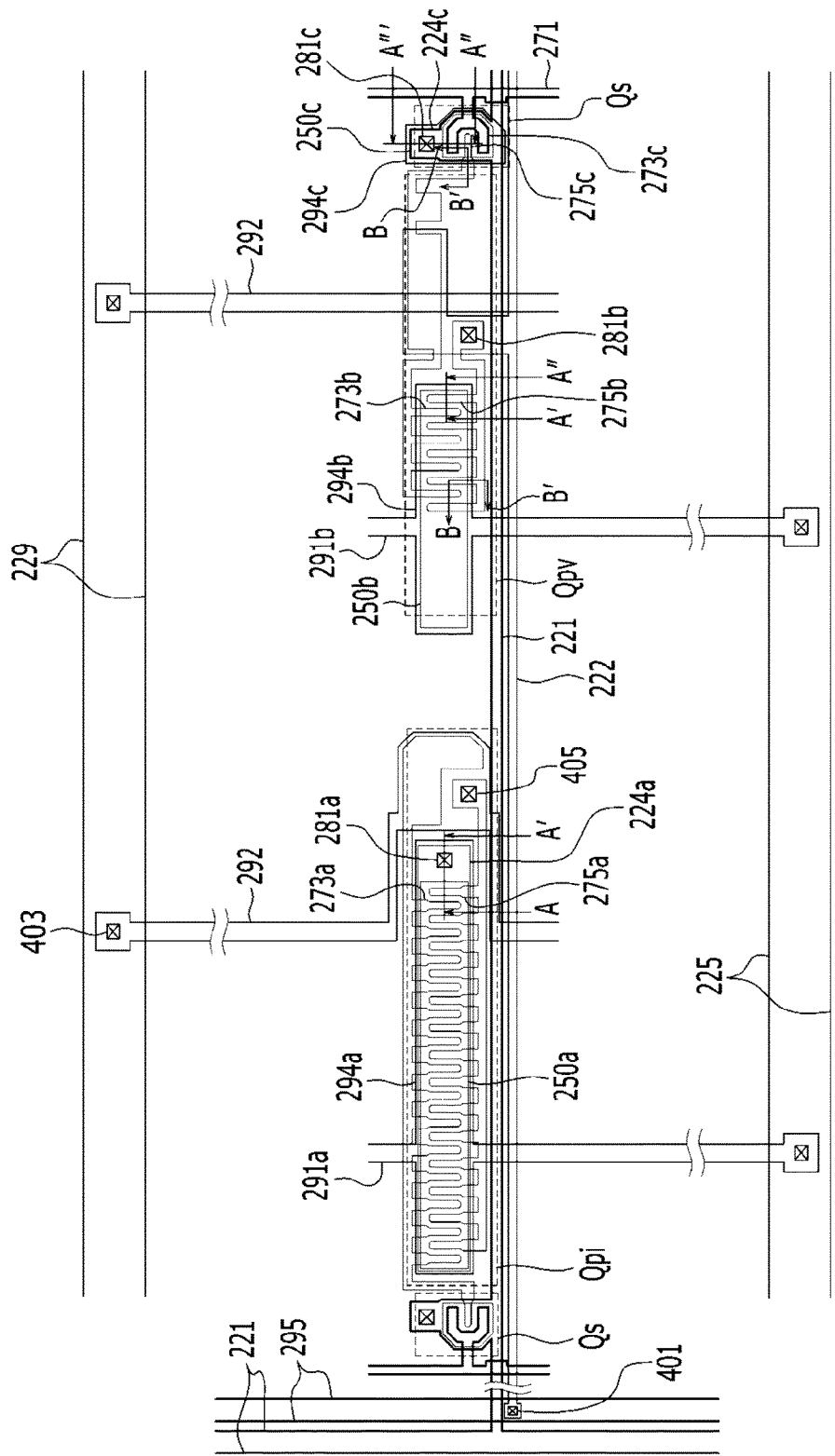
FIG. 4 is a layout view of various optical sensors included in a thin film transistor array panel, according to exemplary embodiments.

An exemplary optical sensor is described in more detail with continued reference to FIGS. 1-3, as well as FIG. 4.

FIG. 4 is a layout view of various optical sensors included in a thin film transistor array panel, according to exemplary embodiments.

Referring to FIG. 3, the visible light sensing transistor Qpv, the infrared light sensing transistor Qpi, and the two switching transistors Qs, which are connected to the visible light sensing transistor Qpv and the infrared light sensing transistor Qpi, respectively, are disposed on an insulation substrate (not illustrated), such as insulation substrate 210 of FIG. 1.

According to exemplary embodiments, the visible light sensing transistor Qpv may have the same cross-sectional structure as the second thin film transistor Qb, the infrared light sensing transistor Qpi may have the same cross-sectional structure as the first thin film transistor Qa, and the switching transistor Qs may have the same cross-sectional structure as the third thin film transistor Qc. That is, the cross-sectional views taken along lines A-A', A'-A", A"-A''', and B-B' of the thin film transistor array panel illustrated in FIG. 4 may be the same as illustrated in FIGS. 1 and 2, respectively. For descriptive convenience, the regions illustrated in FIGS. 1 and 2 are indicated as regions taken along sectional lines A-A', A'-A", A"-A''', and B-B' of the thin film transistor array panel illustrated in FIG. 4, respectively. Further, reference numerals associated with the visible light sensing transistor Qpv, the infrared light sensing transistor Qpi, and the switching transistor Qs illustrated in FIG. 4 are the same as those utilized in association with the first, second, and third thin film transistors Qa, Qb, and Qc illustrated in FIGS. 1 and 2. As such, to avoid obscuring exemplary embodiments described herein, duplicative descriptions of the cross-sectional structures of the visible light sensing transistor Qpv, the infrared light sensing transistor Qpi, and the switching transistor Qs will be omitted.

According to exemplary embodiments, the third lower gate electrode 224$c$ of each switching transistor Qs is connected to a sensing gate line 221 for transmitting a gate signal, the third source electrode 273$c$ is connected to a sensing signal line 271, and the third drain electrode 275$c$ faces the third source electrode 273$c$ on the third semiconductor 250$c$. Although the sensing gate line 221 and the sensing signal line 271 may cross, the sensing gate line 221 and the sensing signal line 271 are insulated from each other on the insulation substrate.

The second upper gate electrode 294$b$ of the visible light sensing transistor Qpv is connected to a reference voltage line 225 for transmitting a reference voltage Vb, the second source electrode 273$b$ is connected to the third drain electrode 275$c$ of the switching transistor Qs, and the second drain electrode 275b is connected to the first driving voltage line 295 for transmitting the first driving voltage Vs1. More specifically, the first driving voltage line 295 may be connected with a connection member 222 through a fourth contact hole (or via) 401, and the connection member 222 may be connected with the second drain electrode 275b of the visible light sensing transistor Qpv through a second contact hole (or via) 281b.

The first lower gate electrode 224a of the infrared light sensing transistor Qpi is connected with the reference voltage line 225 for transmitting the reference voltage Vb, the first source electrode 273a is connected to the third drain electrode 275c of the switching transistor Qs, and the first drain electrode 275a is connected with the second driving voltage line 229 for transmitting the second driving voltage Vs2. More specifically, the second driving voltage line 229 may be connected with a connection member 292 through a fifth contact hole (or via) 403, and the connection member 292 may be connected with the first drain electrode 275a of the infrared light sensing transistor Qpi through a sixth contact hole (or via) 405.

According to exemplary embodiments, the reference voltage line 225 may be disposed on the same layer as that of the sensing gate line 221 and the first lower gate electrode 224a.

In exemplary embodiments, the first driving voltage line 295 may be disposed on the same layer as that of the first upper gate electrode 294a, the second upper gate electrode 294b, and the third upper gate electrode 294c. To this end, the connection member 222 may be disposed on the same layer as that of the sensing gate line 221 and the second lower gate electrode 224c.

According to exemplary embodiments, the second driving voltage line 229 may be disposed on the same layer as that of the sensing gate line 221 and the second lower gate electrode 224c. To this end, the connection member 292 may be disposed on the same layer as that of the first upper gate electrode 294a, the second upper gate electrode 294b, and the third upper gate electrode 294c.

As described above, the various optical sensors included in the thin film transistor array panel may include different semiconductor materials. For example, the visible light sensing transistor Qpv may include amorphous silicon having higher quantum efficiency in the visible light region than the infrared light region, and the infrared light sensing transistor Qpi may include silicon germanium having higher quantum efficiency in the infrared light region than the visible light region. Further, the switching transistor Qs connected with the visible light sensing transistor Qpv or the infrared light sensing transistor Qpi may include a different type of semiconductor material than the visible light sensing transistor Qpv or the infrared light sensing transistor Qpi, or may include the same type of semiconductor material as that of the visible light sensing transistor Qpv.

With continued reference to FIGS. 1-4, an exemplary method of manufacturing a thin film transistor array panel according to exemplary embodiments will be described in more detail with reference to FIGS. 5 to 18.

FIGS. 5-18 are cross-sectional views of the TFT array panel of FIGS. 1, 2, and 4 at various stages of a manufacturing process, according to exemplary embodiments. For instance, FIGS. 5-18 may represent sectional views of the TFT array panel after various successive steps of the manufacturing process, such that a higher numbered figure follows a lower numbered figure, e.g., FIG. 6 follows FIG. 5, and the like.

Figure 5:
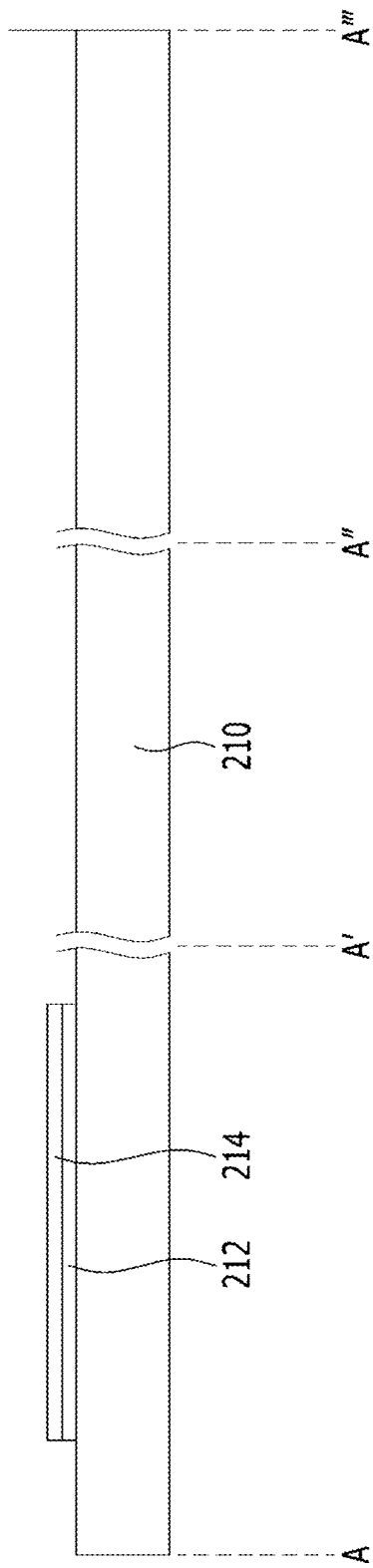
FIGS. 5-18 are cross-sectional views of the TFT array panel of FIGS. 1, 2, and 4 at various stages of a manufacturing process, according to exemplary embodiments.

Referring to FIG. 5, the insulation pattern 212 and the light blocking member 214 are formed (e.g., sequentially formed) on insulation substrate 210 by forming an insulation material, such as silicon nitride (SiNx) and a compound of amorphous germanium, such as amorphous germanium (a-Ge) or amorphous silicon germanium (a-SiGe), on the insulation substrate 210 and patterning the insulation material and the compound of amorphous germanium to form the insulation pattern 212 and the light blocking member 214.

Figure 6:
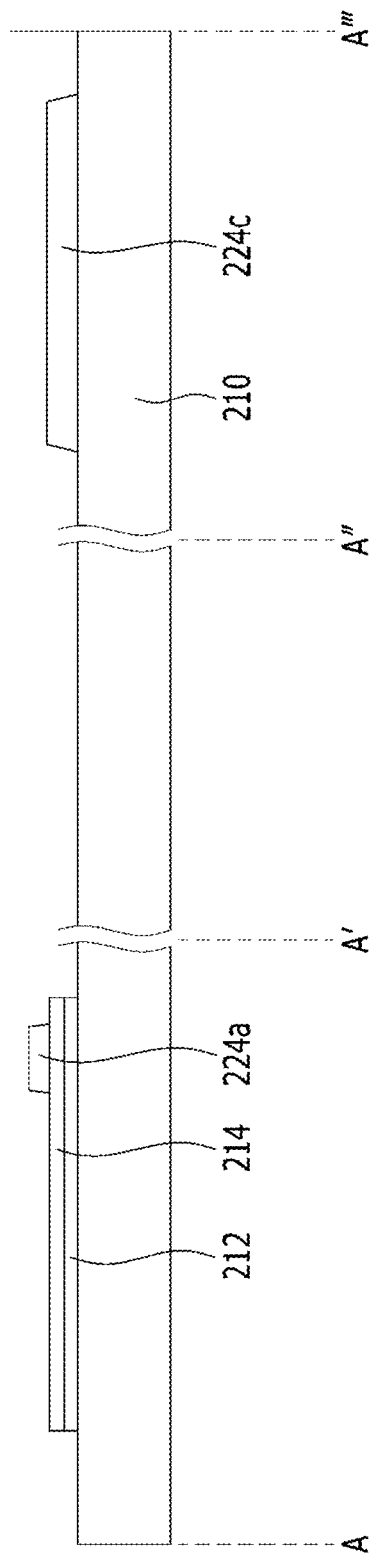

As seen in FIG. 6, the first lower gate electrode 224a and the third lower gate electrode 224c may be respectively formed on a portion of the light blocking member 214 and the insulation substrate by applying a conductive material, such as metal including, for instance, copper (Cu), thereon and patterning the conductive material to form the first lower gate electrode 224a and the third lower gate electrode. To this end, it is contemplated that the first lower gate electrode 224a and the third lower gate electrode 224c may be formed together or in separate steps.

Figure 7:
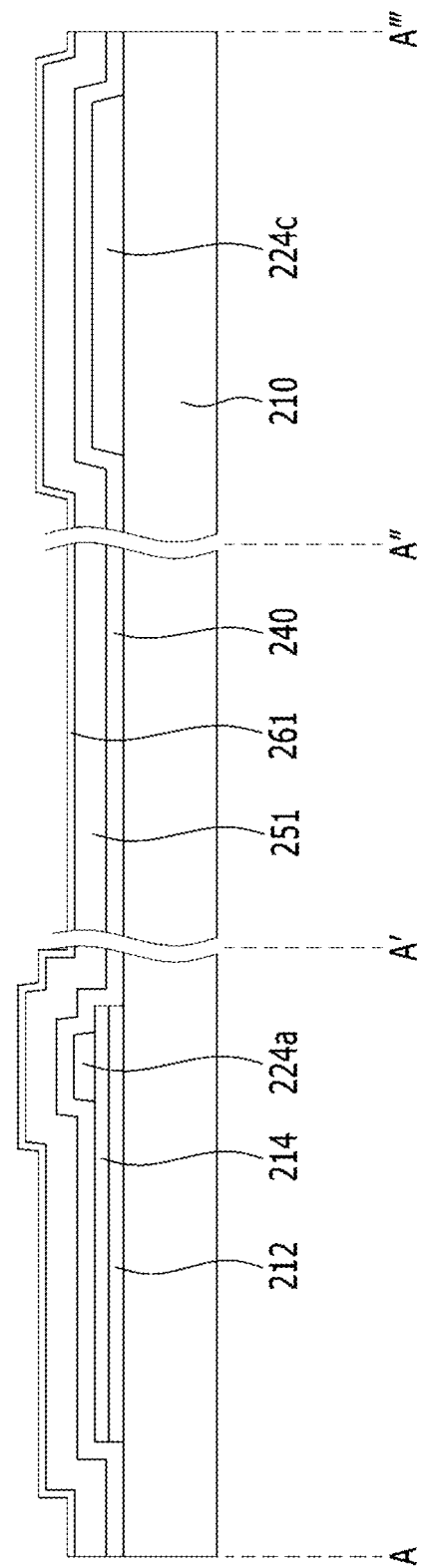

As seen in FIG. 7, the gate insulation layer 240 is formed by applying an insulation material on the first lower gate electrode 224a, the insulation substrate 240, and the third lower gate electrode 224c. A second semiconductor material layer 251 is formed on the gate insulation layer 240. The second semiconductor material layer 251 includes a semiconductor material associated with, for example, the second thin film transistor Qb. In this manner, the second semiconductor material layer 251 may include amorphous silicon (a-Si). A second ohmic contact layer 261 on which an impurity is doped in a high concentration may be formed on the second semiconductor material layer 251.

Figure 8:
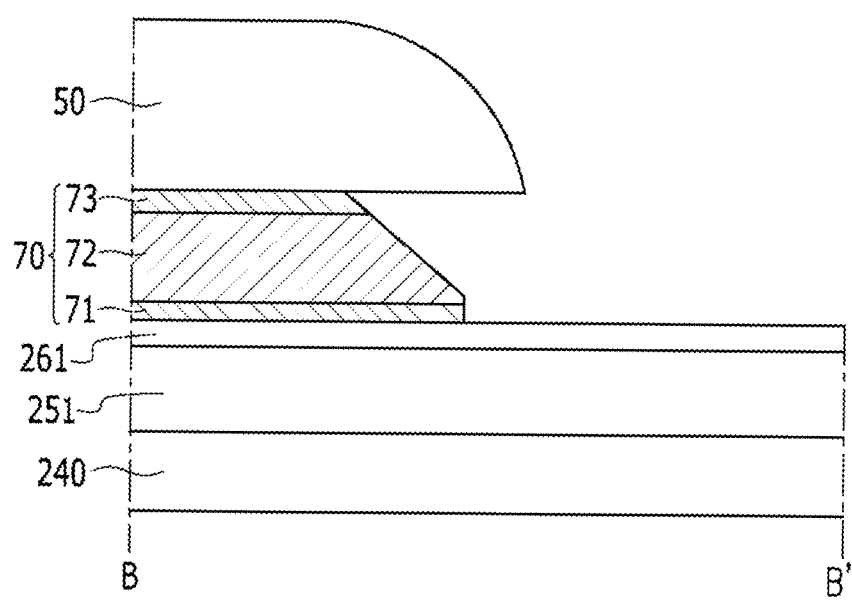

Referring to FIG. 8, an etching passivation material layer 70, such as metal, is formed on the second semiconductor material layer 251 or the second ohmic contact layer 261. A photoresist material is formed on the etching passivation material layer 70, and the photoresist layer 50 is formed by a photolithographic process. The etching passivation layer 70 is formed by etching the etching passivation material layer applied on a lower portion by using the photoresist layer 50 as an etching mask. In this manner, a wet etching method may be used as the etching method. As such, an undercut may be generated under the photoresist layer 50, so that an edge of the patterned etching passivation layer 70 may be disposed at an inner side of the edge of the photoresist layer 50. That is, the photoresist layer 50 may extend further than the etching passivation layer 70.

According to exemplary embodiments, the etching passivation layer 70 may have a single layer structure or a multilayer structure. For example, the etching passivation layer 70 may have a plurality of layers, such as a triple layer structure, including a lower layer 71 formed of molybdenum or an alloy thereof, an intermediate layer 72 formed of aluminum or an alloy thereof, and an upper layer 73 formed of molybdenum or an alloy thereof.

Figure 9:
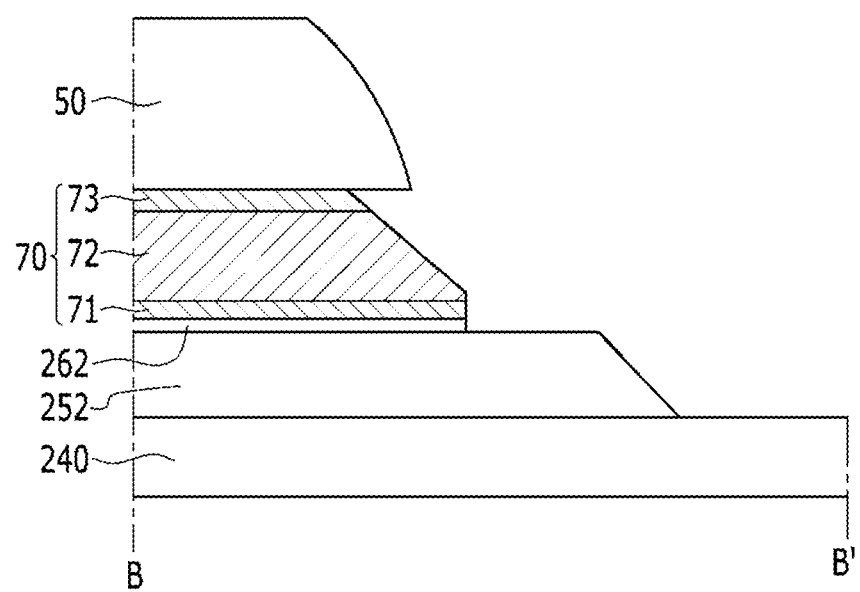

As seen in FIG. 9, a second semiconductor pattern 252 is formed by patterning the second semiconductor material layer 251 using the photoresist layer 50 and the etching passivation layer 70 as an etching mask. When the second ohmic contact layer 261 is present, the second ohmic contact layer 261 is also patterned with the second semiconductor material layer 251 to form a second ohmic contact pattern 262. In this manner, a dry etching method may be used, however, any other suitable patterning process may be utilized. As illustrated in FIG. 9, a portion of the photoresist layer 50 may be removed. An edge of the second semiconductor pattern 252 extends further than an edge of the etching passivation layer 70 to form a protrusion of the second semiconductor pattern 252. Accordingly, the edges of the etching passivation layer 70 and the second semiconductor pattern 252 may form a spaced step shape.

Figure 10:
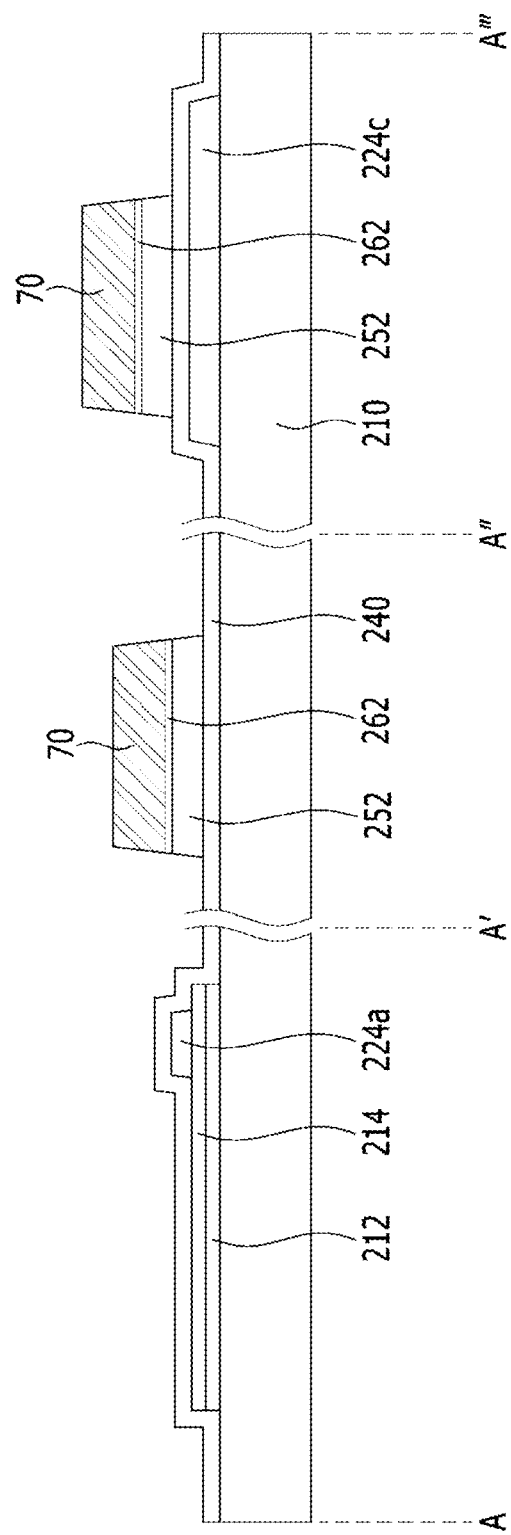

Referring to FIG. 10, the photoresist layer 50 is removed. For illustrative convenience, the step shape of the etching passivation layer 70 and the second semiconductor pattern 252 illustrated in FIG. 9 is not illustrated in FIG. 10.

Figure 11:
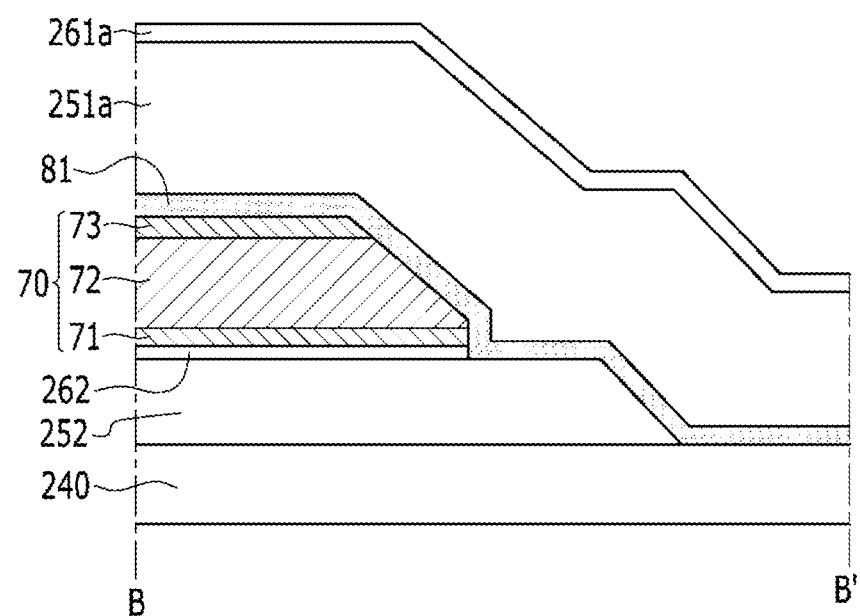
Figure 12:
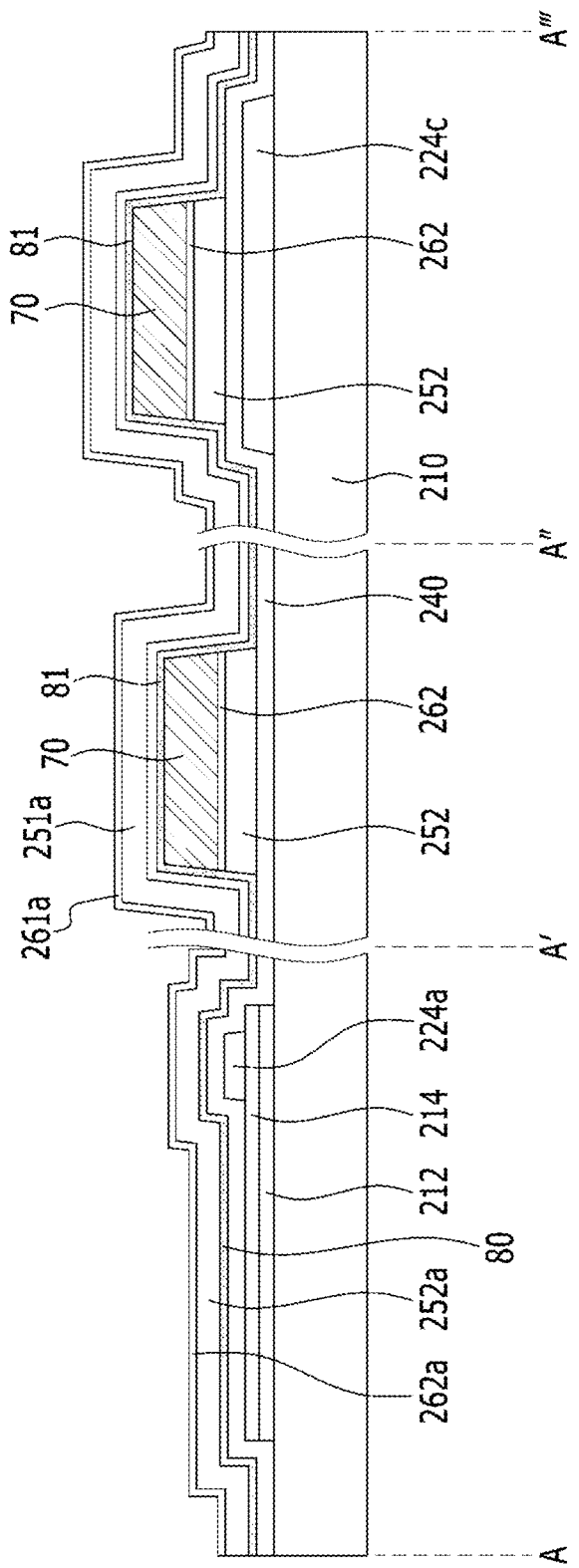

As seen in FIGS. 11 and 12, an insulation layer 81 is formed by forming an insulation material on the etching passivation layer 70, the second semiconductor pattern 252, and the gate insulation layer 240. A first semiconductor material layer 251a is formed on the insulation layer 81. The first semiconductor material layer 251a includes the semiconductor material associated with forming the first thin film transistor Qa. For example, the first semiconductor material layer 251a may include amorphous or crystalline silicon germanium (SiGe), or any other suitable semiconductor material. A first ohmic contact layer 261a on which an impurity is doped in a high concentration may be formed on the first semiconductor material layer 251a.

Figure 13:
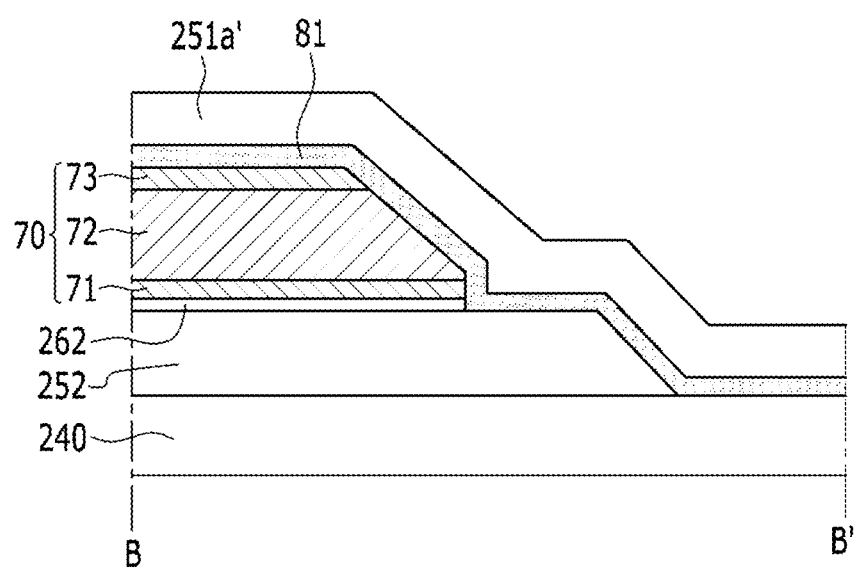
Figure 14:
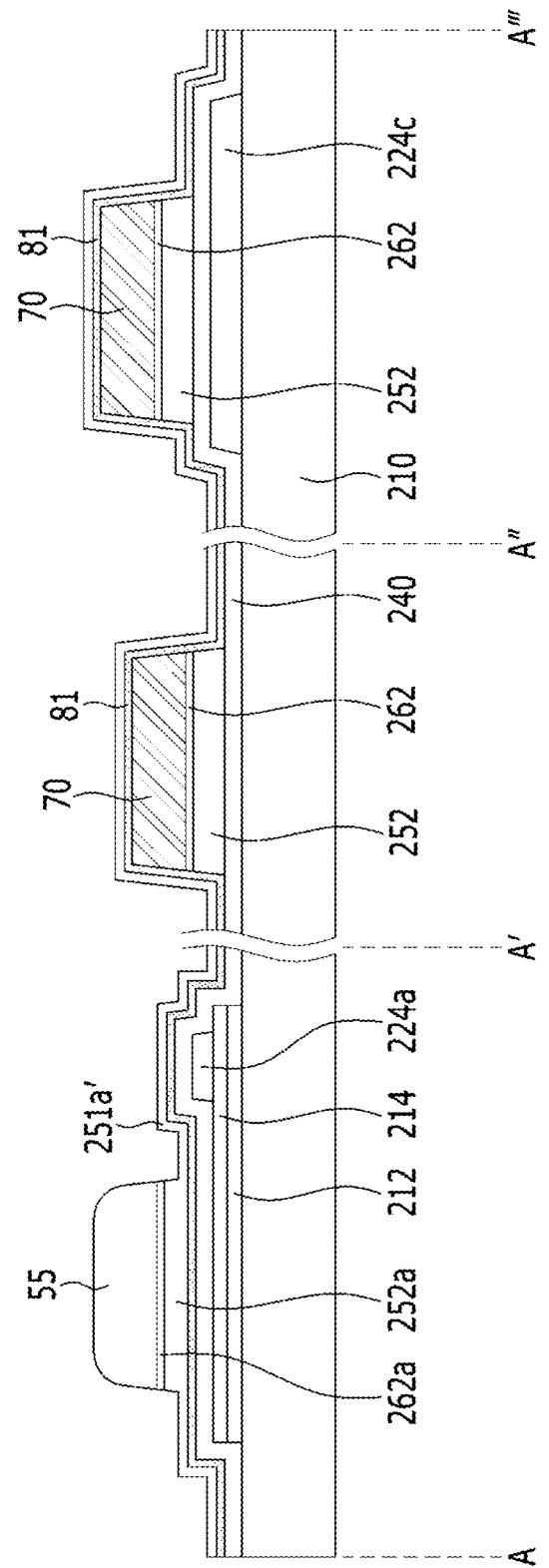

With reference to FIGS. 13 and 14, a photoresist material is formed on the first semiconductor material layer 251a and the first ohmic contact layer 261a, and then a photoresist layer 55 is formed by a photolithographic process or any other suitable patterning technique. The first semiconductor material layer 251a at the lower side is etched using the photoresist layer 55 as an etching mask. In those areas where the first ohmic contact layer 261a is present, the first ohmic contact layer 261a is also patterned with the first semiconductor material layer 251a to form a first ohmic contact pattern 262a. In this manner, a dry etching method (or any other suitable patterning technique) may be used as the etching method. For instance, an etching gas may include sulfur hexafluoride ($SF_6$) gas and chlorine gas ($Cl_2$).

According to exemplary embodiments, the first semiconductor material layer 251a covered by the photoresist layer 55 may form a first semiconductor pattern 252a, and the first semiconductor material layer 251a, which is not covered by the photoresist layer 55 and is exposed, may not be completely removed and be partially left to form a residual semiconductor material layer 251a', in the etching step of the first semiconductor material layer 251a. To this end, the insulation layer 81 disposed under the residual semiconductor material layer 251a' and the first semiconductor pattern 252a may not (or hardly) be etched. As such, FIGS. 13 and 14 illustrate the first semiconductor material layer 251a not being completely removed and is partially left to form the residual semiconductor material layer 251a' in the etching step of the first semiconductor material layer 251a.

Alternatively, the first semiconductor material layer 251a, which is not covered by the photoresist layer 55, is mostly removed in the etching step of the first semiconductor material layer 251a, such that the first semiconductor 250a is formed, and at least a portion of the insulation layer 81 under the first semiconductor 250a may be exposed. It is noted, however, that the etching process is performed to the extent that an opening is not formed in the insulation layer 81, such that the second semiconductor pattern 252 under the insulation layer 81 is not exposed.

Figure 15:
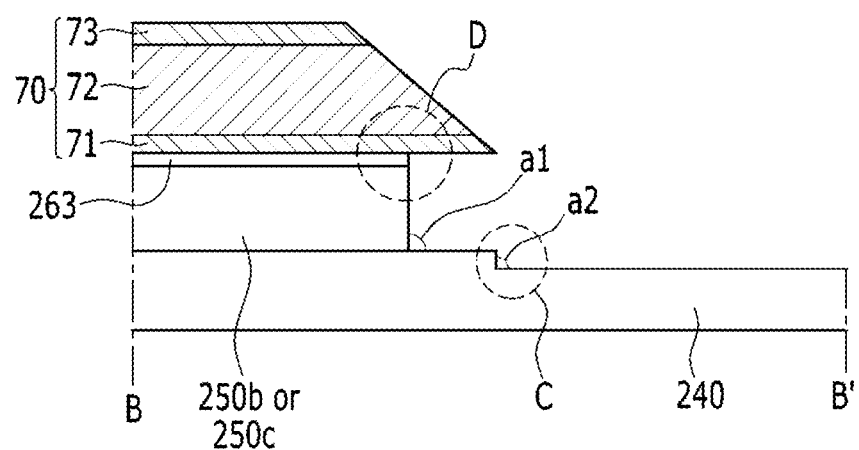
Figure 16:
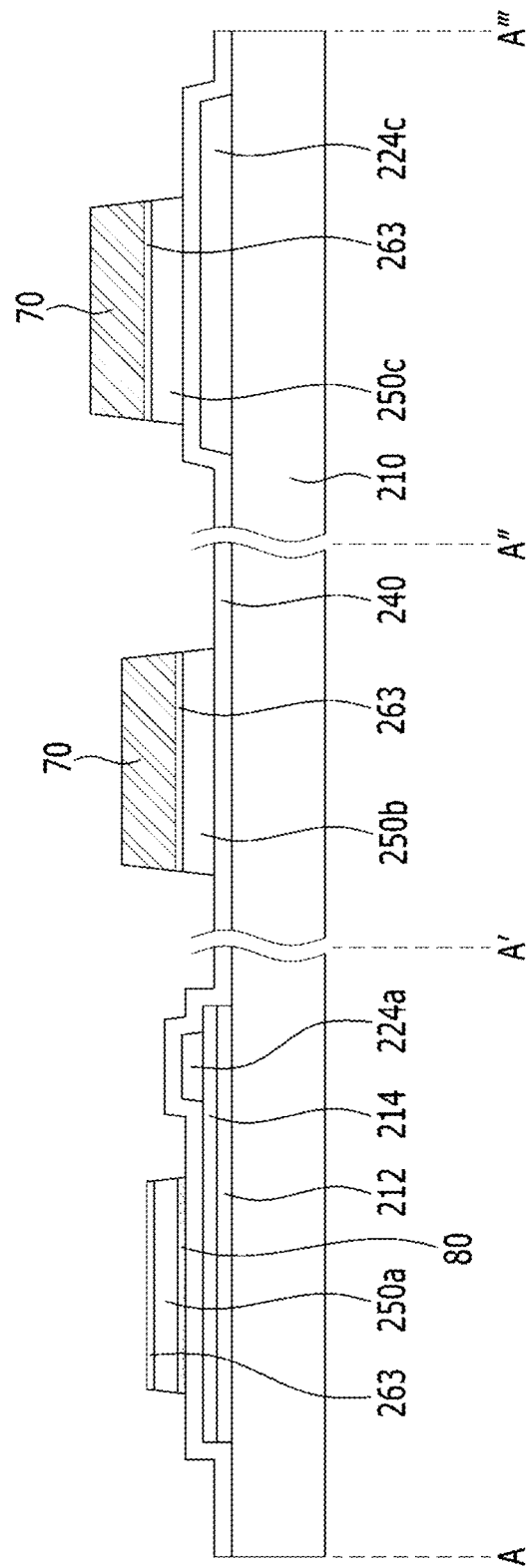

Adverting to FIGS. 15 and 16, the insulator 80 disposed under the first semiconductor 250a is formed by etching the insulation layer 81 where the insulation layer 81 is not covered by the photoresist layer 55. In this manner, the second semiconductor 250b and/or the third semiconductor 250c is formed by etching the protrusion of the second semiconductor pattern 252 that is not covered by the etching passivation layer 70. Where the residual semiconductor material layer 251a' is present, the residual semiconductor material layer 251a' is completely removed before the insulation layer 81 is completely removed in association with forming the insulator 80, such that the first semiconductor 250a is formed. The insulator 80 may be disposed only under the first semiconductor 251a. Where the second ohmic contact pattern 262 is present, e.g., on the protrusion of the second semiconductor pattern 252, is also etched, such that a second ohmic contact pattern 263 may be formed.

According to exemplary embodiments, a dry etching method (or any other suitable patterning process) may be used as the etching method. To this end, an etching gas may include, for instance, sulfur hexafluoride ($SF_6$) gas and oxygen gas ($O_2$). In exemplary embodiments, the etching gas may have substantially the same etching ratio with respect to the insulation layer 81 as the second semiconductor pattern 252. That is, the etching process may be performed using an etching gas having approximately 1:0.9 to approximately 0.9:1 of the etching ratio of the insulation layer 81 to the second semiconductor pattern 252. For example, when mixed gas of sulfur hexafluoride ($SF_6$) gas and oxygen gas ($O_2$) is used as the etching gas, the etching ratio of the insulation layer 81 and the second semiconductor pattern 252 may be adjusted while increasing a flux of sulfur hexafluoride ($SF_6$). As such, etching rates of the insulation layer 81 and the second semiconductor pattern 252 may be controlled to be approximately the same, such that the protrusion of the second semiconductor pattern 252 may be removed after the insulation layer 81 is mostly removed.

When the etching process is performed using the mixed gas of sulfur hexafluoride ($SF_6$) gas and oxygen gas ($O_2$), isotropic etching by a fluorine radical is performed, such that an undercut D is generated under the etching passivation layer 70 as illustrated in FIG. 15. That is, an edge of the second semiconductor 250b or the third semiconductor 250c formed by the etching is disposed at an inner side of the edge of the etching passivation layer 70. Namely, the etching passivation layer 70 may extend further than the second semiconductor 250b or the third semiconductor 250c. The first angle a1 between the side surface of the edge of the second semiconductor 250b or the third semiconductor 250c and the surface of the insulation substrate 210 or the gate insulation layer 240 may be larger than approximately 90 degrees and smaller than approximately 180 degrees.

As described above, the undercut D is generated at the edge portion of the second semiconductor 250b or the third semiconductor 250c under the etching passivation layer 70, such that the edge of the etching passivation layer 70 faces the exposed gate insulation layer 240. In this manner, the gate insulation layer 240, which is not covered by the etching passivation layer 70, is partially removed by the etching gas. As illustrated in FIG. 15, the stepped portion C of the gate insulation layer 240 is formed along a point facing the edge of the etching passivation layer 70. The second angle a2 disposed between the side surface of the gate insulation layer 240 in the stepped portion C and the surface of the insulation substrate 210 or the surface of the gate insulation layer 240 in the remaining portions may be larger than approximately 90 degrees and smaller than approximately 180 degrees.

As illustrated in FIG. 15, neither the insulation layer 81 nor the second semiconductor pattern 252 is left in the edge portion of the second semiconductor 250b or the third semiconductor 250c. To this end, the gate insulation layer 240 and the second semiconductor 250b or the third semiconductor 250c form a shape including at least two steps. In this manner, the stepped portions at which angles a1 and a2 are formed in association with the gate insulation layer 240 is disposed outside the edge of the second semiconductor 250b or the third semiconductor 250c and are spaced apart from each other by distance D1, as described in association with FIG. 2.

In exemplary embodiments, the photoresist layer 55 is removed and the etching passivation layer 70 is removed. The etching passivation layer 70 may be removed using a wet etching method; however, any other suitable patterning process may be utilized.

Figure 17:
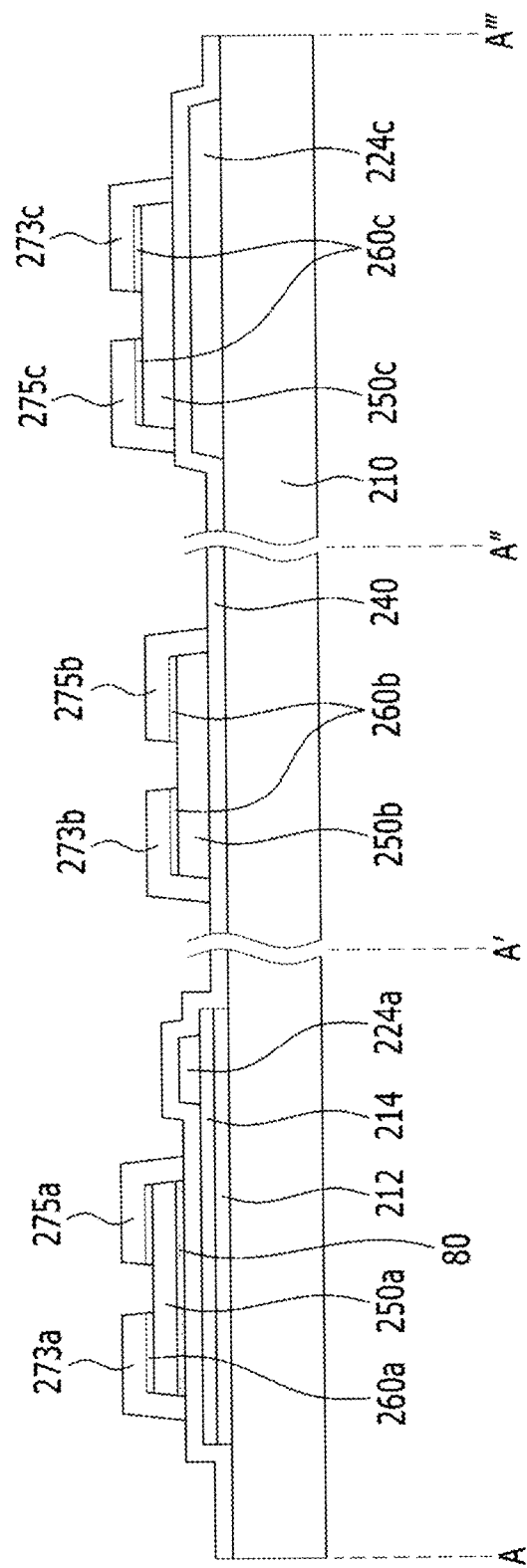

With reference to FIG. 17, the first source electrode 273a, the first drain electrode 275a, the second source electrode 273b, and the second drain electrode 275b, and/or the third source electrode 273c and the third drain electrode 275c are formed by depositing a conductive material, such as metal, on the first semiconductor 250a and the second semiconductor 250b or the third semiconductor 250c. The deposited metal is patterned in association with the first semiconductor 250a and the second semiconductor 250b and/or the third semiconductor 250c. In this manner, the first ohmic contact pattern 262a disposed between the first source electrode 273a and the first drain electrode 275a, and the second ohmic contact pattern 263 disposed between the second source electrode 273b and the second drain electrode 275b and/or the third source electrode 273c and the third drain electrode 275c are also removed, such that the pair of first ohmic contact members 260a, the pair of second ohmic contact members 260b, and/or the pair of third ohmic contact members 260c may be formed.

According to exemplary embodiments, at least one of the second source electrode 273b, the second drain electrode 275b, the third source electrode 273c, and the third drain electrode 275c, which are disposed on the edge portion of the second semiconductor 250b or the third semiconductor 250c, is disposed along at least two steps formed by the gate insulation layer 240 and the second semiconductor 250b or the third semiconductor 250c, such that the profile thereof is smooth and a possibility of short-circuits being developed is low.

Figure 18:
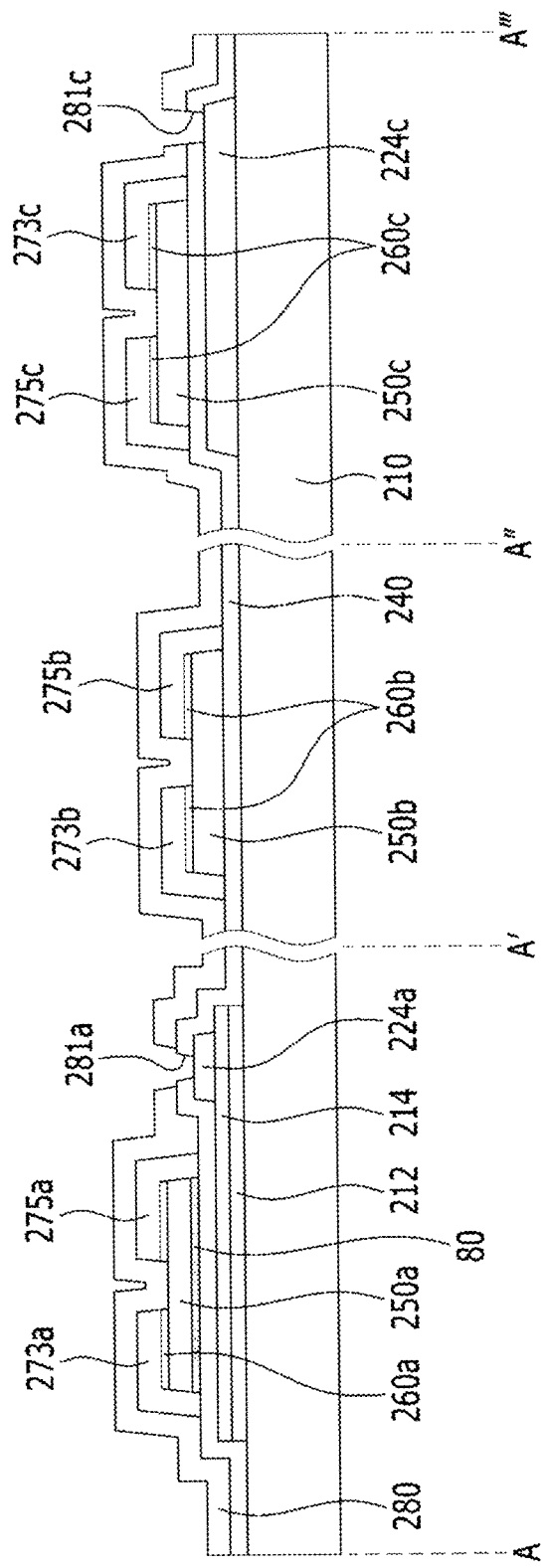

Adverting to FIG. 18, the passivation layer 280 is formed by depositing an insulation material on the first source electrode 273a, the first drain electrode 275a, the second source electrode 273b, and the second drain electrode 275b and/or the third source electrode 273c and the third drain electrode 275c.

As also illustrated in FIGS. 1 and 2, contact holes 281a and 281c are formed in the passivation layer 280 and the gate insulation layer 240. Adverting to FIGS. 1 and 2, the first upper gate electrode 294a, the second upper gate electrode 294b, and the third upper gate electrode 294c are formed by depositing the conductive material on the passivation layer 280 and patterning the deposited conductive material.

According to exemplary embodiments, the aforementioned method of manufacturing the thin film transistor array panel may be utilized to form the aforementioned infrared light sensing transistor Qpi and the visible light sensing transistor Qpv or the switching transistor Qs of the thin film transistor array panel including the optical sensor illustrated in the FIGS. 3 and 4.

A structure of the thin film transistor manufactured utilizing the previously described method will be described in more detail with reference to FIGS. 19 and 20.

Figure 19:
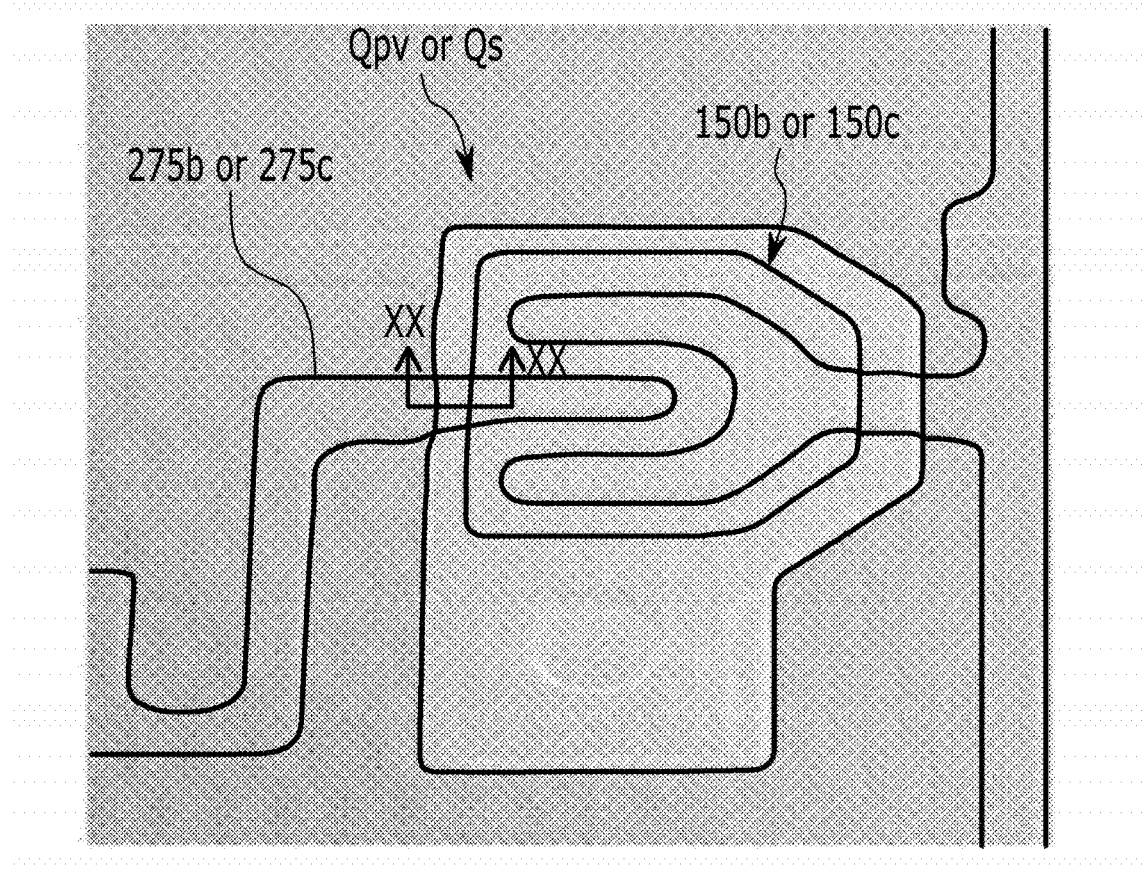
FIG. 19 is a plan view of a thin film transistor of a thin film transistor array panel, according to exemplary embodiments.

FIG. 19 is a plan view of a thin film transistor of a thin film transistor array panel, according to exemplary embodiments. FIG. 20 is a cross-sectional view of the thin film transistor of FIG. 19 taken along sectional line XX-XX.

Figure 20:
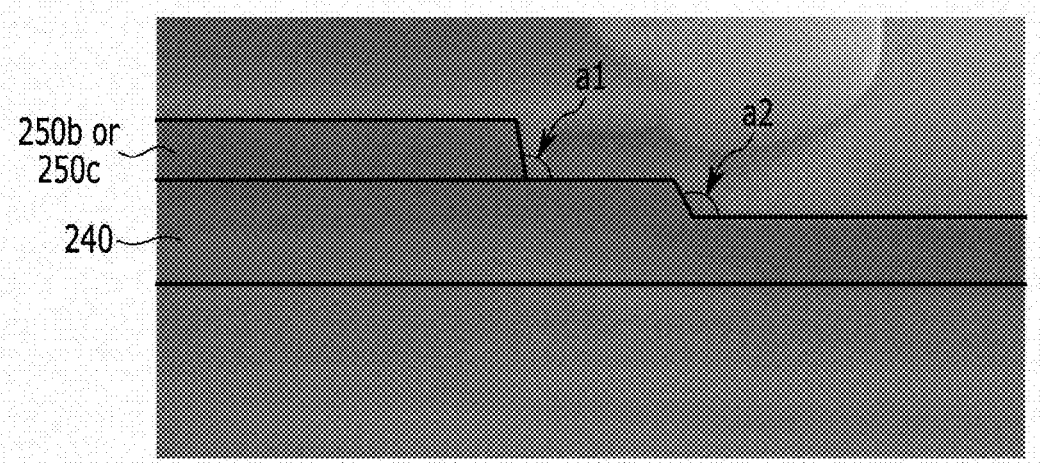
FIG. 20 is a cross-sectional view of the thin film transistor of FIG. 19 taken along sectional line XX-XX, according to exemplary embodiments.

The thin film transistor illustrated in FIGS. 19 and 20 may be the second thin film transistor Qb including the second semiconductor 250b or the third thin film transistor Qc including the third semiconductor 250c. Referring to FIG. 20, the second semiconductor 250b or the third semiconductor 250c is disposed on the gate insulation layer 240. In this manner, the surface of the edge of the second semiconductor 250b or the third semiconductor 250c forms the first angle a1 larger than approximately 90 degrees and smaller than approximately 180 degrees with respect to the surface of the insulation substrate (not illustrated) or the gate insulation layer 240. To this end, the gate insulation layer 240 forms the stepped portion in a region spaced apart from the edge of the second semiconductor 250b or the third semiconductor 250c. The second angle a2 between the side surface of the stepped portion of the gate insulation layer 240 and the surface of the remaining portions of the insulation substrate or the gate insulation layer 240 is larger than approximately 90 degrees and smaller than approximately 180 degrees.

As described above, since the gate insulation layer 240 and the second semiconductor 250b or the third semiconductor 250c form at least two steps at the edge portion of the second semiconductor 250b or the third semiconductor 250c, the profile of the conductor, such as the second source electrode 273b, the second drain electrode 275b, the third source electrode 273c, or the third drain electrode 275c, which is disposed thereon and cross the edge of the second semiconductor 250b or the third semiconductor 250c may be relatively smooth, such that it is possible to reduce a possibility of a short being developed in the associated conductor.

While certain exemplary embodiments and implementations have been described herein, other embodiments and modifications will be apparent from this description. Accordingly, the invention is not limited to such embodiments, but rather to the broader scope of the presented claims and various obvious modifications and equivalent arrangements.

What is claimed is:

1. A method of manufacturing a thin film transistor array panel, comprising:

forming a first insulation layer on a substrate;

forming a first semiconductor material layer on the first insulation layer;

forming an etching passivation material layer on the first semiconductor material layer;

forming a first photoresist layer on the etching passivation material layer;

etching, using the first photoresist layer as a mask, the etching passivation material layer to form an etching passivation layer;

etching, using the first photoresist layer as a mask, the first semiconductor material layer to form a first semiconductor pattern comprising a protrusion not covered by the etching passivation layer;

forming, sequentially, a second insulation layer and a second semiconductor material layer on the etching passivation layer and the first semiconductor pattern;

forming a second photoresist layer on the second semiconductor material layer;

etching, using the second photoresist layer as a mask, the second semiconductor material layer to form a first semiconductor;

etching the first insulation layer not covered by the second photoresist layer and the protrusion not covered by the etching passivation layer to form a second semiconductor comprising an undercut region under the etching passivation layer; and forming, in the first insulation layer, a stepped portion spaced apart from an edge of the second semiconductor.

2. The method of claim 1, wherein:
the stepped portion of the first insulation layer faces an edge of the etching passivation layer.

3. The method of claim 2, wherein:
etching ratios of the second insulation layer and the first semiconductor pattern are substantially the same.

4. The method of claim 3, wherein:
at least one of an angle between a side surface of the edge of the second semiconductor and a surface of the substrate and an angle between a side surface of the stepped portion and the surface of the substrate is larger than approximately 90 degrees and smaller than approximately 180 degrees.

5. The method of claim 4, wherein:
etching the first semiconductor material layer to form the first semiconductor comprises leaving a portion of the first semiconductor material layer at a portion not covered by the second photoresist layer, the left portion forming a residual semiconductor material layer; and
the residual semiconductor material layer is simultaneously etched in association with etching the first insulation layer and the protrusion.

6. The method of claim 5, wherein:
an etching gas used in association with etching the first insulation layer and the protrusion comprises sulfur hexafluoride gas ($SF_6$) and oxygen gas ($O_2$).

7. The method of claim 6, wherein:
the first semiconductor material layer comprises amorphous silicon.

8. The method of claim 7, wherein:
the second semiconductor material layer comprises silicon germanium.

9. The method of claim 8, further comprising:
removing the second photoresist layer and the etching passivation layer after forming the second semiconductor and the stepped portion of the first insulation layer; and
forming an electrode on the first semiconductor and the second semiconductor.

10. The method of claim 9, wherein:
the electrode comprises an electrode covering the edge of the second semiconductor and the stepped portion.

11. The method of claim 1, wherein:
etching ratios of the first insulation layer and the first semiconductor pattern are substantially the same.

12. The method of claim 1, wherein:
at least one of an angle between a side surface of the edge of the second semiconductor and a surface of the substrate and an angle between a side surface of the stepped portion and the surface of the substrate is larger than approximately 90 degrees and smaller than approximately 180 degrees.

13. The method of claim 1, wherein:
etching the first semiconductor material layer to form the first semiconductor comprises leaving a portion of the first semiconductor material layer at a portion not covered by the second photoresist layer, the left portion forming a residual semiconductor material layer; and
the residual semiconductor material layer is simultaneously etched in association with etching the first insulation layer and the protrusion.

* * * * *